(12) United States Patent
Lee et al.

(10) Patent No.: US 9,040,378 B2
(45) Date of Patent: May 26, 2015

(54) METHODS OF FORMING SEMICONDUCTOR DEVICES INCLUDING VERTICAL CHANNELS AND SEMICONDUCTOR DEVICES FORMED USING SUCH METHODS

(71) Applicants: Bo-Young Lee, Hwaseong-si (KR); Jong-Wan Choi, Suwon-si (KR); Dae-Hun Choi, Yongin-si (KR); Myoung-Bum Lee, Seoul (KR)

(72) Inventors: Bo-Young Lee, Hwaseong-si (KR); Jong-Wan Choi, Suwon-si (KR); Dae-Hun Choi, Yongin-si (KR); Myoung-Bum Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/309,018

(22) Filed: Jun. 19, 2014

(65) Prior Publication Data
US 2015/0064885 A1   Mar. 5, 2015

(30) Foreign Application Priority Data

Aug. 27, 2013   (KR) ........................ 10-2013-0101924

(51) Int. Cl.
| | | |
|---|---|---|
| *H01L 21/336* | (2006.01) | |
| *H01L 27/115* | (2006.01) | |
| *H01L 21/28* | (2006.01) | |
| *H01L 21/02* | (2006.01) | |

(52) U.S. Cl.
CPC .... *H01L 27/11556* (2013.01); *H01L 21/28273* (2013.01); *H01L 21/02488* (2013.01); *H01L 21/02532* (2013.01); *H01L 21/02595* (2013.01)

(58) Field of Classification Search
USPC .................................. 438/268, 269; 257/324
See application file for complete search history.

(56) References Cited

U.S. PATENT DOCUMENTS

| | | | |
|---|---|---|---|
| 7,999,307 B2 | 8/2011 | Kim et al. | |
| 2010/0327323 A1* | 12/2010 | Choi | ............................ 257/202 |
| 2011/0291176 A1* | 12/2011 | Lee et al. | ...................... 257/324 |
| 2011/0303971 A1 | 12/2011 | Lee et al. | |
| 2012/0146122 A1 | 6/2012 | Whang et al. | |
| 2012/0241846 A1 | 9/2012 | Kawasaki et al. | |
| 2013/0307047 A1* | 11/2013 | Sakuma et al. | ............... 257/316 |

FOREIGN PATENT DOCUMENTS

KR   1020110060729   6/2011

* cited by examiner

*Primary Examiner* — Reema Patel
(74) *Attorney, Agent, or Firm* — Myers Bigel Sibley & Sajovec, P.A.

(57) ABSTRACT

Methods of forming semiconductor devices including vertical channels and semiconductor devices formed using such methods are provided. The methods may include forming a stack including a plurality of insulating patterns alternating with a plurality of conductive patterns on an upper surface of a substrate and forming a hole through the stack. The hole may expose sidewalls of the plurality of insulating patterns and the plurality of conductive patterns. The sidewalls of the plurality of insulating patterns may be aligned along a first plane that is slanted with respect to the upper surface of the substrate, and midpoints of the respective sidewalls of the plurality of conductive patterns may be aligned along a second plane that is substantially perpendicular to the upper surface of the substrate.

20 Claims, 10 Drawing Sheets

METHODS OF FORMING SEMICONDUCTOR DEVICES INCLUDING VERTICAL CHANNELS AND SEMICONDUCTOR DEVICES FORMED USING SUCH METHODS

CROSS-REFERENCE TO RELATED APPLICATION

This U.S. non-provisional patent application claims priority under 35 U.S.C. §119 to Korean Patent Application No. 10-2013-0101924, filed on Aug. 27, 2013, in the Korean Intellectual Property Office, the disclosure of which is hereby incorporated by reference in its entirety.

FIELD

Embodiments of the present inventive concept relate to methods of forming semiconductor devices including vertical channels and semiconductor devices formed using such methods.

BACKGROUND

Integration densities of semiconductor devices have increased to manufacture high performance devices at low cost. Since integration densities of two-dimensional planar semiconductor devices may be determined by a size of a unit cell, fine patterning technologies may be required to increase the integration densities. However, most fine patterning technologies may require expensive apparatuses. Accordingly, vertical type semiconductor devices including vertically arranged cells in three dimensions have been suggested to fabricate highly integrated semiconductor devices.

SUMMARY

A method of fabricating a semiconductor device may include stacking a first insulating layer, a first polycrystalline silicon layer, alternating second insulating layers and second polycrystalline silicon layers, a third polycrystalline silicon layer, and a third insulating layer on a substrate and forming a vertical channel, which vertically passes through the first insulating layer, the first polycrystalline silicon layer, the second insulating layers, the second polycrystalline silicon layers, the third polycrystalline silicon layer, and the third insulating layer and contacts the substrate. The method may also include forming a trench, which vertically passes through the second insulating layers, the second polycrystalline silicon layers, the third polycrystalline silicon layer, and the third insulating layer and partially recesses the first polycrystalline silicon layer to expose the first polycrystalline silicon layer on a bottom thereof. The method may further include expanding the trench to expose the first insulating layer by partially removing the first polycrystalline silicon layer, second polycrystalline silicon layers, and third polycrystalline silicon layer exposed in the trench. A laterally recessed depth of the first polycrystalline silicon layer may be greater than laterally recessed depths of the second polycrystalline silicon layers.

According to various embodiments, the second polycrystalline silicon layers and the third polycrystalline silicon layer may be doped with impurities.

In various embodiments, the second polycrystalline silicon layers may have doping concentrations gradually increasing from the lowermost layer toward the uppermost layer.

In various embodiments, the first polycrystalline silicon layer may have a lower doping concentration than the lowermost second polycrystalline silicon layer.

According to various embodiments, the first polycrystalline silicon layer may not be doped with impurities.

In various embodiments, the impurities may include at least one of P or B.

In various embodiments, the expanding of the trench may include performing a wet etch process using an etchant including aqueous ammonia.

According to various embodiments, the method may include transforming the first polycrystalline silicon layer, the second polycrystalline silicon layers, and the third polycrystalline silicon layer into metal silicides.

In various embodiments, the transforming may include forming a metal layer on an inner wall of the expanded trench and performing a silicidation process.

According to various embodiments, the method may include forming an impurity region in the substrate, forming an insulating spacer on an inner wall and bottom of the expanded trench, etching the first insulating layer exposed on the bottom of the expanded trench to expose the substrate and forming a common source line filling the expanded trench and in contact with the impurity region.

In various embodiments, the method may additionally include forming a fourth insulating layer on the common source line, the insulating spacer, and the vertical channel, forming a bitline contact plug passing through the fourth insulating layer and electrically connected to the vertical channel and forming a bitline on the fourth insulating layer and the bitline contact plug.

In various embodiments, before forming the vertical channel, the method may also include forming a channel hole, which vertically passes through the first insulating layer, the first polycrystalline silicon layer, the second insulating layers, the second polycrystalline silicon layers, the third polycrystalline silicon layer, and the third insulating layer and exposes the substrate, and forming a charge storage layer on a sidewall of the channel hole.

According to various embodiments, forming the charge storage layer may include forming an external blocking insulating layer, an internal blocking insulating layer, a charge trapping layer, and a tunnel insulating layer on the sidewall of the channel hole.

According to various embodiments, after forming the vertical channel, the method may also include forming a filling insulating layer filling the channel hole and forming a channel pad in contact with the vertical channel on the filling insulating layer.

A method of forming a semiconductor device may include forming a lower insulating layer on a substrate, forming a first polycrystalline silicon layer having a first impurity concentration on the lower insulating layer and forming alternating intermediate insulating layers and second polycrystalline silicon layers on the first polycrystalline silicon layer. The second polycrystalline silicon layers may have a second impurity concentration higher than the first impurity concentration. The method may also include forming an upper insulating layer on the second polycrystalline silicon layers, forming a third polycrystalline silicon layer having a third impurity concentration higher than the second impurity concentration on the upper insulating layer, forming a capping insulating layer on the third polycrystalline silicon layer and forming a trench, which vertically passes through the capping insulating layer, the third polycrystalline silicon layer, the upper insulating layer, and the intermediate insulating layers and second polycrystalline silicon layers and partially recesses the first polycrystalline silicon layer. The method may further include forming an expanded trench exposing the lower insulating layer by partially removing the first polycrystalline silicon layer, second polycrystalline silicon layers, and third polycrystalline silicon layer exposed in the trench.

A method of forming an integrated circuit device may include forming a stack including a plurality of insulating patterns alternating with a plurality of conductive patterns on an upper surface of a substrate and forming a hole through the stack. The hole may expose sidewalls of the plurality of insulating patterns and the plurality of conductive patterns. The sidewalls of the plurality of insulating patterns may be aligned along a first plane that is slanted with respect to the upper surface of the substrate, and midpoints of the respective sidewalls of the plurality of conductive patterns may be aligned along a second plane that is substantially perpendicular to the upper surface of the substrate.

According to various embodiments, each of the sidewalls of the plurality of conductive patterns may be recessed with respect to an adjacent one of the sidewalls of the plurality of insulating patterns.

In various embodiments, the plurality of conductive patterns may include a respective plurality of semiconductor patterns doped with an impurity, and the plurality of conductive patterns may have impurity concentrations different from each other.

In various embodiments, a lower one of the plurality of conductive patterns relative to the substrate may have a first impurity concentration, and an upper one of the plurality of conductive patterns relative to the substrate may have a second impurity concentration higher than the first impurity concentration.

According to various embodiments, forming the hole may include forming a preliminary hole through the stack by etching the plurality of insulating patterns and the plurality of conductive patterns and laterally etching the plurality of conductive patterns exposed by the preliminary hole.

In various embodiments, laterally etching the plurality of conductive patterns may include laterally etching an upper one of the plurality of conductive patterns relative to the substrate less than a lower one of the plurality of conductive patterns relative to the substrate.

In various embodiments, laterally etching the plurality of conductive patterns may include performing a wet etch process using an etchant including ammonia.

According to various embodiments, the method may further include converting each of the plurality of conductive patterns into a metal silicide after laterally etching the plurality of conductive patterns.

According to various embodiments, the integrated circuit device may include a vertical nonvolatile memory device. A lowermost one of the plurality of conductive patterns relative to the substrate may include a ground selection gate electrode, and an uppermost one of the plurality of conductive patterns relative to the substrate may include a string selection gate electrode.

A method of forming an integrated circuit device may include forming a plurality of insulating patterns alternating with a plurality of semiconductor patterns on a substrate and performing a first etching process to etch the plurality of insulating patterns and the plurality of semiconductor patterns to form a preliminary hole exposing sidewalls of the plurality of insulating patterns and the plurality of semiconductor patterns. An upper one of the plurality of semiconductor patterns relative to the substrate may be laterally etched more than a lower one of the plurality of semiconductor patterns relative to the substrate. The method may also include performing a second etching process to laterally etch the sidewalls of the plurality of semiconductor patterns to expand the preliminary hole into a hole. The upper one of the plurality of semiconductor patterns may be laterally etched less than the lower one of the plurality of semiconductor patterns.

According to various embodiments, sidewalls of the plurality of semiconductor patterns including a sidewall of the hole may be aligned along a plane substantially perpendicular to an upper surface of the substrate.

In various embodiments, sidewalls of the plurality of insulating patterns including the sidewall of the hole may be aligned along a plane slanted with respect to the upper surface of the substrate. Each of the sidewalls of the plurality of insulating patterns may protrude laterally toward a central axis of the hole more than the sidewall of an adjacent one of the plurality of semiconductor patterns.

According to various embodiments, each of the plurality of semiconductor patterns except for the semiconductor pattern that is closest to the substrate may have an impurity concentration that exceeds an impurity concentration of a respective one of the plurality of semiconductor patterns that is directly below it.

According to various embodiments, each of the plurality of semiconductor patterns except for the semiconductor pattern that is closest to the substrate may be laterally etched more than a respective one of the plurality of semiconductor patterns that may is below it during the first etching process and may be laterally etched less than the respective one of the plurality of semiconductor patterns during the second etching process.

According to various embodiments, each of the plurality of semiconductor patterns may include a polysilicon layer. The method may further include forming a metal layer on a sidewall of the hole and performing a silicidation process to transform the plurality of semiconductor patterns into a respective plurality of metal silicide patterns. Sidewalls of the plurality of metal silicide patterns that are exposed by the hole may be substantially vertically aligned.

A method of forming a vertical nonvolatile memory device may include forming a plurality of insulating patterns alternating with a plurality of semiconductor patterns on a substrate. The plurality of semiconductor patterns may have impurity concentrations that are different from each other. The method may also include etching the plurality of insulating patterns and the plurality of semiconductor patterns to form a preliminary hole, the preliminary hole having a sidewall that is slanted with respect to an upper surface of the substrate.

According to various embodiments, an upper one of the plurality of semiconductor patterns relative to the substrate may have a first impurity concentration and a lower one of the plurality of semiconductor patterns relative to the substrate may have a second impurity concentration that is lower than the first impurity concentration.

According to various embodiments, the method may further include laterally etching the plurality of semiconductor patterns exposed by the preliminary hole to form a hole. Sidewalls of the plurality of semiconductor patterns including a sidewall of the hole may be aligned along a plane substantially perpendicular to the upper surface of the substrate.

In various embodiments, the method may further include forming a metal layer on the sidewall of the hole and performing a silicidation process to transform the plurality of semiconductor patterns into a respective plurality of metal silicide patterns.

According to various embodiments, sidewalls of the plurality of insulating patterns may include the sidewall of the hole. Each of the sidewalls of the plurality of insulating patterns may laterally toward a central axis of the hole more than the sidewall of an adjacent one of the plurality of semiconductor patterns.

DETAILED DESCRIPTION

Figure 1:
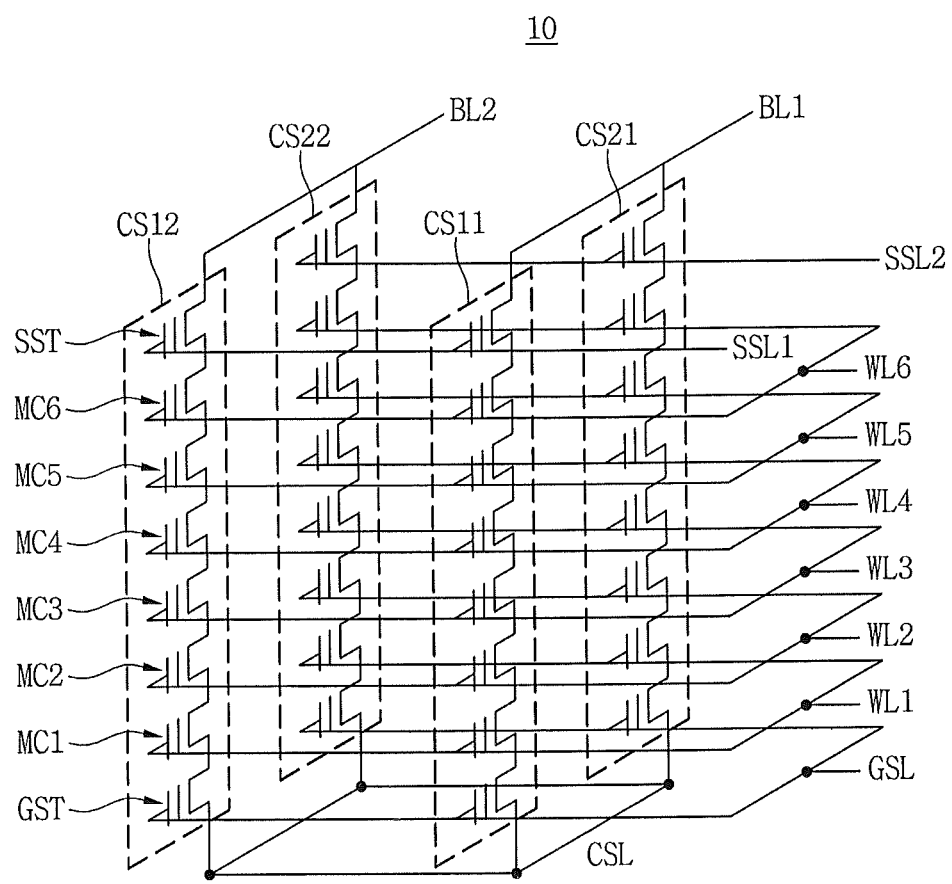
FIG. 1 is a circuit diagram of a memory cell array of a semiconductor device according to some embodiments of the present inventive concept.

Various embodiments according to the present inventive concept will now be described below with reference to the accompanying drawings in which some embodiments are shown. The inventive concept may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity. In the following explanation, the same reference numerals denote the same components throughout the specification.

The terminology used herein to describe some embodiments according to the inventive concept is not intended to limit the scope of the invention. The articles "a," "an," and "the" are singular in that they have a single referent; however the use of the singular form in the present document should not preclude the presence of more than one referent. In other words, elements of the embodiments referred to in the singular may number one or more, unless the context clearly indicates otherwise. It will be further understood that the terms "comprises," "comprising," "includes," or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation. In addition, the device may be reoriented in other ways (rotated 90 degrees or at other orientations) and the descriptors used herein should be interpreted accordingly.

It will be understood that, although the terms first, second, A, B, etc. may be used herein in reference to elements of the embodiments, such elements should not be construed as limited by these terms. For example, a first element could be termed a second element, and a second element could be termed a first element, without departing from the scope of the embodiments. Herein, the term "and/or" includes any and all combinations of one or more referents.

Embodiments are described herein with reference to cross-sectional and perspective views that are schematic illustrations of idealized embodiments and intermediate structures. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

FIG. 1 is a circuit diagram of a memory cell array of a semiconductor device according to some embodiments of the present inventive concept.

Referring to FIG. 1, the memory cell array 10 may include a plurality of vertically extending cell strings CS11, CS12, CS21, and CS22. Each of the cell strings CS11, CS12, CS21, and CS22 may include a ground selection transistor GST, a plurality of memory cell transistors MC1, MC2, . . . , and MC6, and a string selection transistor SST which are connected in series. Although each of the cell strings CS11, CS12, CS21, and CS22 is illustrated as having one ground selection transistor GST and one string selection transistor SST in FIG. 1, each of the cell strings CS11, CS12, CS21, and CS22 may include two or more ground selection transistors GST and/or two or more string selection transistors SST, which are connected in series. In addition, although each of the cell strings CS11, CS12, CS21, and CS22 is illustrated as having six memory cell transistors MC1, MC2, . . . , and MC6, each of the cell strings CS11, CS12, CS21, and CS22 may include at least eight or more memory cell transistors MCX.

The plurality of cell strings CS11, CS12, CS21, and CS22 may be connected in row and column units. The string selection transistor SST of each of the cell strings CS 11, CS 12, CS21, and CS22 may be connected to a corresponding one of bitlines BL1 and BL2. For example, the cell strings CS11 and CS21 commonly connected to a first bitline BL1 may form a first column, and the cell strings CS12 and CS22 commonly connected to a second bitline BL2 may form a second column. In addition, the string selection transistor SST of each of the cell strings CS11, CS12, CS21, and CS22 may be connected to each of the string selection lines SSL1 and SSL2, respectively. For example, the cell strings CS11 and CS12 commonly connected to a first string selection line SSL1 may form a first row, and the cell strings CS21 and CS22 commonly connected to a second string selection line SSL2 may form a second row.

The ground selection transistor GST of each of the cell strings CS11, CS12, CS21, and CS22 may be connected to the ground selection line GSL. The common source line CSL may be connected to the ground selection transistor GST of each of the cell strings CS11, CS12, CS21, and CS22.

The memory cell transistors MC1, MC2, . . . , and MC6 located at the substantially same height may be respectively connected to the same wordlines WL1, WL2, . . . , and WL6. For example, a first memory cell transistor MC1 connected to the ground selection transistor GST may be connected to a first memory cell transistor MC1 in an adjacent column through a first wordline WL1.

Figure 2:
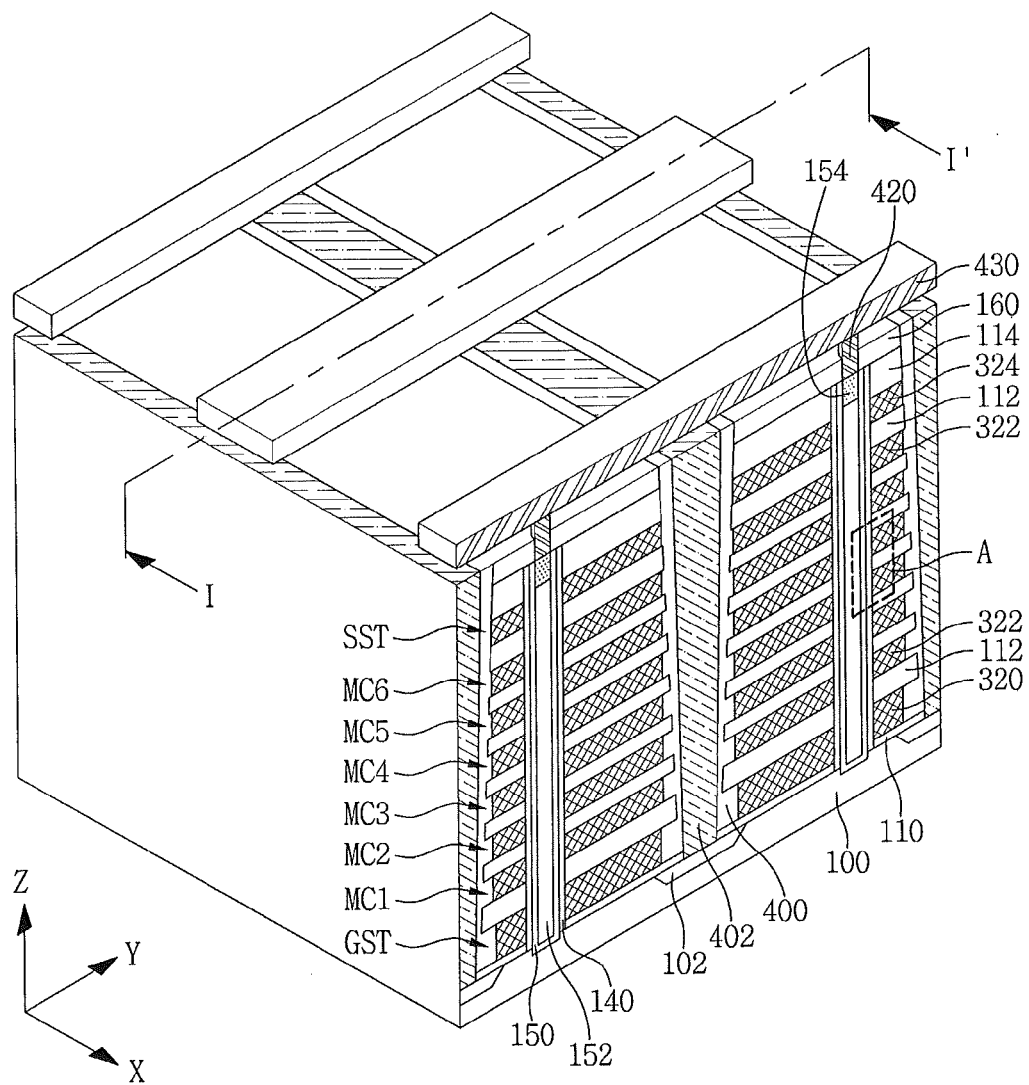
FIG. 2 is a perspective view of a semiconductor device according to some embodiments of the present inventive concept.

FIG. 2 is a perspective view of a semiconductor device according to some embodiments of the present inventive concept.

Referring to FIG. 2, a semiconductor device 1000 according to some embodiments of the present inventive concept may include a lower insulating layer 110, intermediate insulating layers 112, an upper insulating layer 114, a ground selection gate electrode 320, a cell gate electrode 322, and a string selection gate electrode 324 which are alternately stacked on a substrate 100, and a vertical channel 150.

The substrate 100 may include, for example, a silicon substrate, a germanium substrate, a silicon-germanium substrate, or a silicon-on-insulator (SOI) substrate.

A plurality of impurity regions 102 extending in an X direction and spaced apart from each other in a Y direction, which is substantially perpendicular to the X direction, may be provided in the substrate 100. Cylindrical vertical channels 150 extending in a Z direction, which is substantially perpendicular to the X direction and the Y direction, may be formed on the substrate 100 between two adjacent impurity regions 102. Bottoms of the vertical channels 150 may be in contact with a surface of the substrate 100. The vertical channel 150 may include silicon.

A filling insulating layer 152 may be formed in the vertical channel 150. The filling insulating layer 152 may include an insulating material such as, for example, silicon oxide, silicon oxynitride, or silicon nitride.

A channel pad 154 may be formed on the filling insulating layer 152 in the vertical channel 150. The channel pad 154 may function as a drain region of each cell string described in FIG. 1 (CS11, CS12, CS21, and CS22 in FIG. 1). The channel pad 154 may include doped silicon in which impurities such as boron (B) are doped. A charge storage layer 140 may be formed on an outer sidewall of the vertical channel 150. The charge storage layer 140 will be described in detail with reference to FIG. 4.

The ground selection gate electrode 320 extending in the X direction may be formed on the substrate 100 between adjacent impurity regions 102. The ground selection gate electrode 320 may surround outer sidewalls of the vertical channel 150 and the charge storage layer 140. The ground selection gate electrode 320 may include a conductive material such as a metal silicide. For example, the ground selection gate electrode 320 may include titanium silicide, tantalum silicide, tungsten silicide, cobalt silicide, or nickel silicide. The ground selection gate electrode 320 may function as the ground selection line described in FIG. 1 (GSL in FIG. 1).

The plurality of cell gate electrodes 322 may be formed along the outer sidewalls of the vertical channel 150 and the charge storage layer 140 on top of the ground selection gate electrode 320. The cell gate electrodes 322 may be spaced apart from each other in the Z direction. The cell gate electrodes 322 may include a metal silicide. For example, the cell gate electrodes 322 may include titanium silicide, tantalum silicide, tungsten silicide, cobalt silicide, or nickel silicide.

The cell gate electrodes 322 may function as the wordlines described in FIG. 1 (WL1, WL2, . . . , and WL6 in FIG. 1).

The string selection gate electrode 324 may be formed along the outer sidewalls of the vertical channel 150 and the charge storage layer 140 and on top of the plurality of cell gate electrodes 322. The string selection gate electrode 324 may include a metal silicide. For example, the string selection gate electrode 324 may include titanium silicide, tantalum silicide, tungsten silicide, cobalt silicide, or nickel silicide. The string selection gate electrode 324 may function as the string selection line described in FIG. 1 (SSL1 and SSL2 in FIG. 1).

Thicknesses of the ground selection gate electrode 320, the cell gate electrodes 322, and the string selection gate electrode 324 may be different. For example, the ground selection gate electrode 320 may be thicker than the cell gate electrodes 322 and the string selection gate electrode 324.

Sidewalls of the lower, intermediate, and upper insulating layers 110, 112, and 114 may protrude laterally from respective sidewalls of the ground selection gate electrode 320, the cell gate electrodes 322, and the string selection gate electrode 324. Accordingly, sidewalls of the ground selection gate electrode 320, the cell gate electrodes 322, and the string selection gate electrode 324 may be recessed with respect to the respective sidewalls of the lower, intermediate, and upper insulating layers 110, 112, and 114. Recessed distances of the sidewalls of the ground selection gate electrode 320, the cell gate electrodes 322, and the string selection gate electrode 324 with respect to adjacent ones of the sidewalls of the lower, intermediate, and upper insulating layers 110, 112, and 114 may be different from each other. For example, the recessed distances of the sidewalls of the ground selection gate electrode 320, the cell gate electrodes 322, and the string selection gate electrode 324 may decrease along the Z direction from the ground selection gate electrode 320 to the string selection gate electrode 324.

The lower insulating layer 110 may be interposed between the ground selection gate electrode 320 and the substrate 100, and the plurality of intermediate insulating layers 112 may be interposed between the ground selection gate electrode 320, the plurality of cell gate electrodes 322 and the string selection gate electrode 324. The upper insulating layer 114 may be formed on the string selection gate electrode 324. The lower, intermediate, and upper insulating layers 110, 112, and 114 may include an insulating material, for example, silicon oxide, silicon nitride, or silicon oxynitride.

A common source line 402 may be formed to extend in the X direction on each impurity region 102. An insulating spacer 400 may be formed on each sidewall of the common source line 402 to electrically isolate the ground selection gate electrode 320, cell gate electrodes 322, and string selection gate electrode 324 from the common source line 402.

Bitline contact plugs 420 may be formed on the vertical channel 150 and the channel pad 154, and bitlines 430 extending in the Y direction may be formed on the bitline contact plugs 420.

Referring again to FIGS. 1 and 2, the vertical channel 150 may form cell strings CS11, CS12, CS21, and C22, together with an adjacent charge storage layer 140, a ground selection gate electrode 320, cell gate electrodes 322, and a string selection gate electrode 324. For example, the vertical channel 150, the ground selection gate electrode 320, and the charge storage layer 140 interposed therebetween may operate as the ground selection transistor GST. The vertical channel 150, a plurality of cell gate electrodes 322, and the charge storage layer 140 interposed therebetween may operate as the memory cell transistors MC1, MC2, . . . , and MC6. The vertical channel 150, the string selection gate electrode 324, and the charge storage layer 140 interposed therebetween may operate as the string selection transistor SST.

It will be understood that the memory cell arrays 10 described in FIGS. 1 and 2 are provided as example embodiments of the present inventive concept, and a number of wordlines WLX, a number of string selection lines SSLX, and a number of ground selection lines GSLX are not limited thereto. For example, two or more string selection lines SSLX may be sequentially formed in the Y direction, or two or more ground selection lines GSLX may be sequentially formed in the Y direction. In addition, the number of wordlines WLX may be, for example, 8, 16, or 32. A number of cell strings CSXY connected to a bitline BL is also not limited to the number of cell strings CSXY described in FIGS. 1 and 2, and may vary depending on the design of the memory cell array 10.

FIGS. 3A to 3J are cross-sectional views taken along the line I-I' of FIG. 2 illustrating intermediate structures that are formed during the fabrication of a semiconductor device according to some embodiments of the present inventive concept.

Figure 3A:
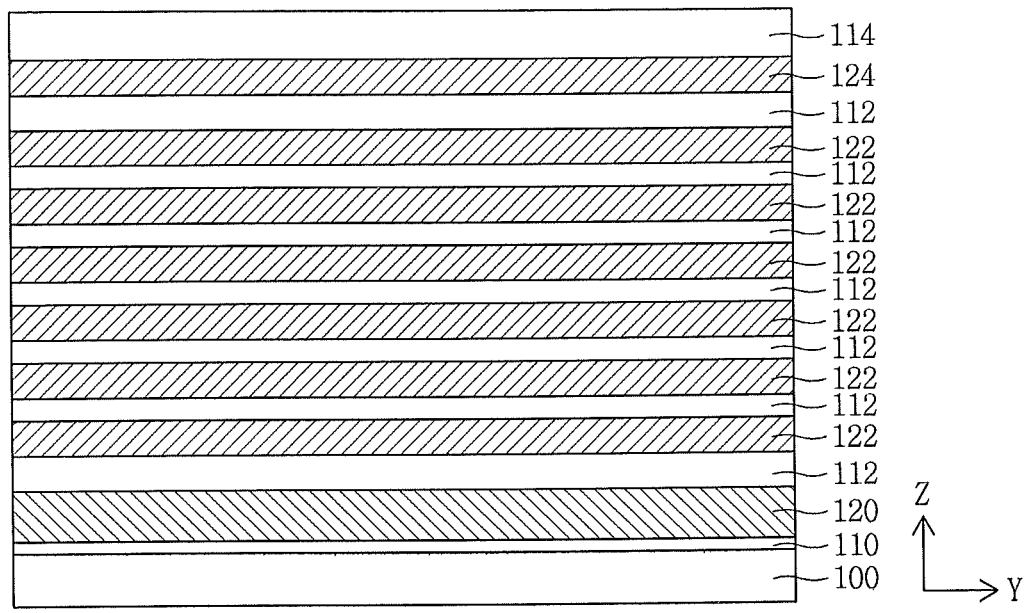
FIGS. 3A to 3J are cross-sectional views taken along the line I-I' of FIG. 2 illustrating intermediate structures that are formed during the fabrication of a semiconductor device according to some embodiments of the present inventive concept.

Referring to FIG. 3A, a method of forming a semiconductor device according to some embodiments of the present inventive concept may include forming a lower insulating layer 110 on a substrate 100, forming a preliminary ground selection gate electrode 120 on the lower insulating layer 110, and alternately forming a plurality of intermediate insulating layers 112 and a plurality of preliminary cell gate electrodes 122 on the preliminary ground selection gate electrode 120. The number of preliminary cell gate electrodes 122 may vary depending on a number of memory cell transistors. In addition, the method may include forming a preliminary string selection gate electrode 124 on the uppermost intermediate insulating layer 112, and forming an upper insulating layer 114 on the preliminary string selection gate electrode 124.

The lower, intermediate, and upper insulating layers 110, 112, and 114 may include an insulating material, for example, silicon oxide, silicon nitride, or silicon oxynitride. The thicknesses of the lower, intermediate, and upper insulating layers 110, 112, and 114 may be different from each other.

The preliminary ground selection gate electrode 120, the preliminary cell gate electrodes 122, and the preliminary string selection gate electrode 124 may include respective polycrystalline silicon layers that are doped with an impurity. Impurity concentrations of the polycrystalline silicon layers may increase along the Z direction, from the preliminary ground selection gate electrode 120 to the preliminary string selection gate electrode 124. For example, some of the preliminary cell gate electrodes 122, which are located at higher levels with respect to the substrate 100, and the preliminary string selection gate electrode 124 may have impurity concentrations higher than impurity concentrations of the preliminary ground selection gate electrode 120 and some of the preliminary cell gate electrodes 122, which are located at lower levels with respect to the substrate 100. In some embodiments, the impurity concentrations of the preliminary ground selection gate electrode 120, the preliminary cell gate electrodes 122, and the preliminary string selection gate electrode 124 may gradually increase along the Z direction and thus may be different from each other. In some embodiments, however, some adjacent ones of the preliminary ground selection gate electrode 120, the preliminary cell gate electrodes 122, and the preliminary string selection gate electrode 124 may have the same impurity concentration.

For example, in one such embodiment, the preliminary ground selection gate electrode 120 and the preliminary cell gate electrode 122 may have a first impurity concentration, the next two lowest preliminary cell gate electrodes 122 may have a second impurity concentration that is higher than the first impurity concentration, the next two lowest preliminary cell gate electrodes 122 may have a third impurity concentration that is higher than the second impurity concentration, and the highest preliminary cell gate electrode 122 may have a fourth impurity concentration that is higher than the third impurity concentration.

In some embodiments, each of the preliminary ground selection gate electrode 120, the preliminary cell gate electrodes 122, and the preliminary string selection gate electrode 124 may have a uniform impurity concentration along the Z direction. It will be understood that, however, each of the preliminary ground selection gate electrode 120, the preliminary cell gate electrodes 122, and the preliminary string selection gate electrode 124 can have an impurity concentration varying along the Z direction. (e.g., increasing impurity concentration with increasing height above the substrate 100 in other embodiments.)

In some embodiments, the preliminary ground selection gate electrode 120 may include un-doped polycrystalline silicon that is not doped with an impurity. The thicknesses of the preliminary ground selection gate electrode 120, the preliminary cell gate electrodes 122, and the preliminary string selection gate electrode 124 may be different. For example, the preliminary ground selection gate electrode 120 may be thicker than the preliminary cell gate electrodes 122 and the preliminary string selection gate electrode 124. Although each of the preliminary ground selection gate electrode 120 and the preliminary string selection gate electrode 124 is described as being formed in a single layer in FIG. 3A, each of the preliminary ground selection gate electrode 120 and the preliminary string selection gate electrode 124 may include two or more layers.

Figure 3B:
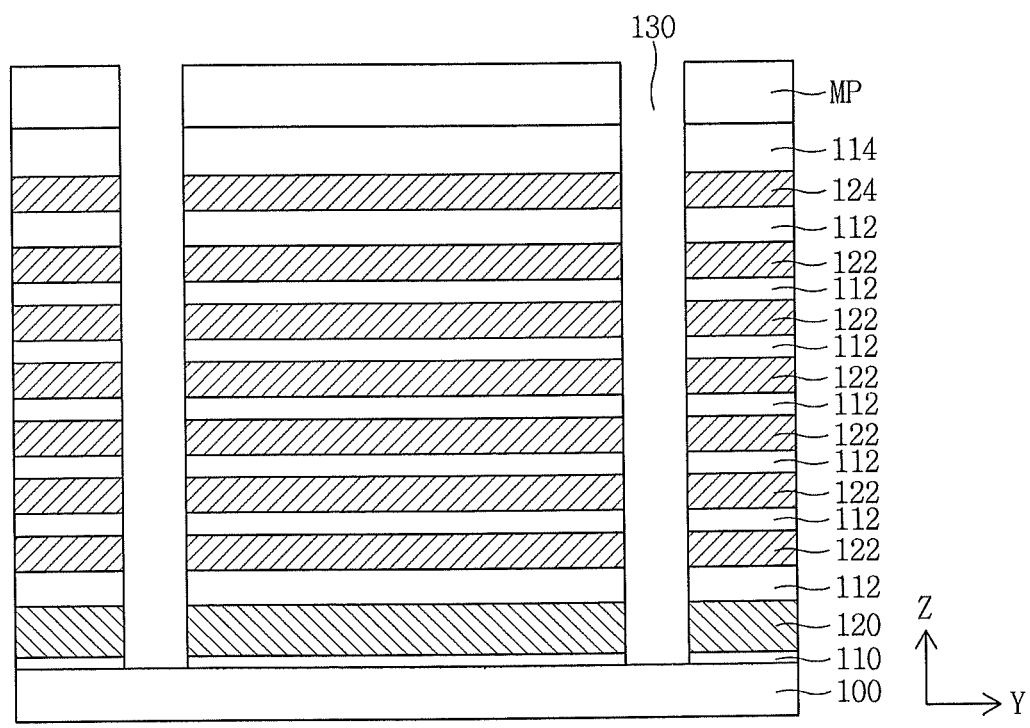

Referring to FIG. 3B, the method may include forming a channel hole 130 passing through the lower, intermediate, and upper insulating layers 110, 112, and 114, the preliminary ground selection gate electrode 120, the preliminary cell gate electrodes 122, and the preliminary string selection gate electrode 124 and exposing the substrate 100. For example, forming the channel hole 130 may include forming a mask pattern MP on the upper insulating layer 114, and anisotropically etching the upper insulating layer 114, the preliminary string selection gate electrode 124, the intermediate insulating layers 112, the preliminary cell gate electrodes 122, the preliminary ground selection gate electrode 120, and the lower insulating layer 110 until an upper surface of the substrate 100 is exposed using the mask pattern MP as an etch mask. The channel hole 130 may be formed in a hole shape. The mask pattern MP may include a photoresist. The mask pattern MP may be removed after forming the channel hole 130.

Figure 3C:
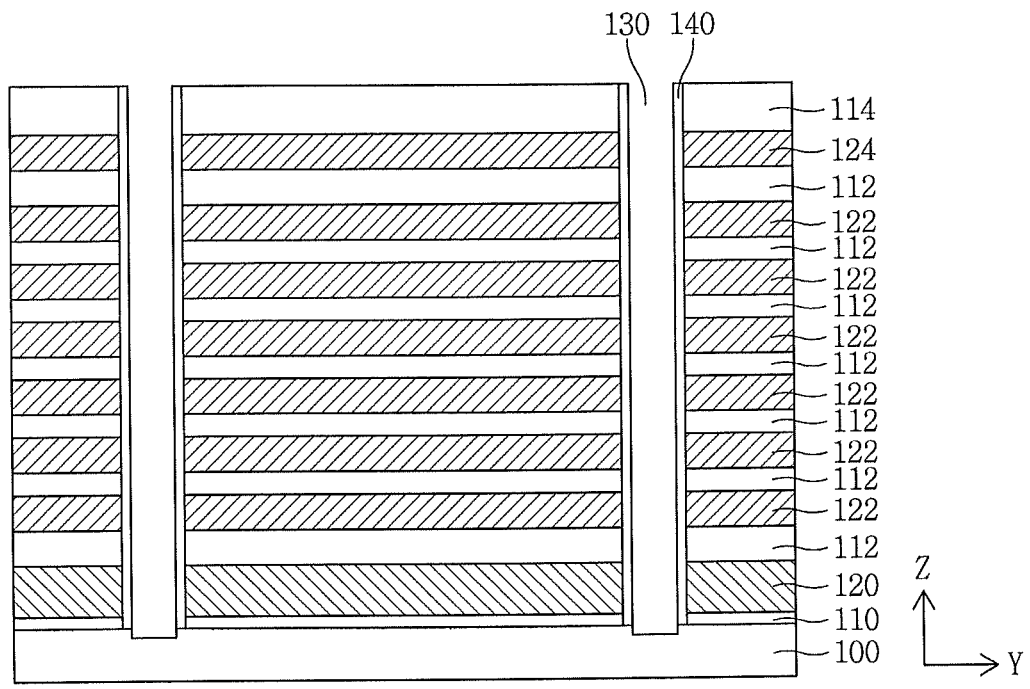

Referring to FIG. 3C, the method may include forming a charge storage layer 140 on a sidewall of the channel hole 130. The formation of the charge storage layer 140 may include conformally forming an insulating material for storing charges on the upper insulating layer 114, the sidewall of the channel hole 130, and the substrate 100 exposed by the channel hole 130, and removing the insulating material formed on the upper insulating layer 114 and the substrate 100 using, for example, an anisotropic etching method. The surface of the substrate 100 in the channel hole 130 may be recessed.

Figure 3D:
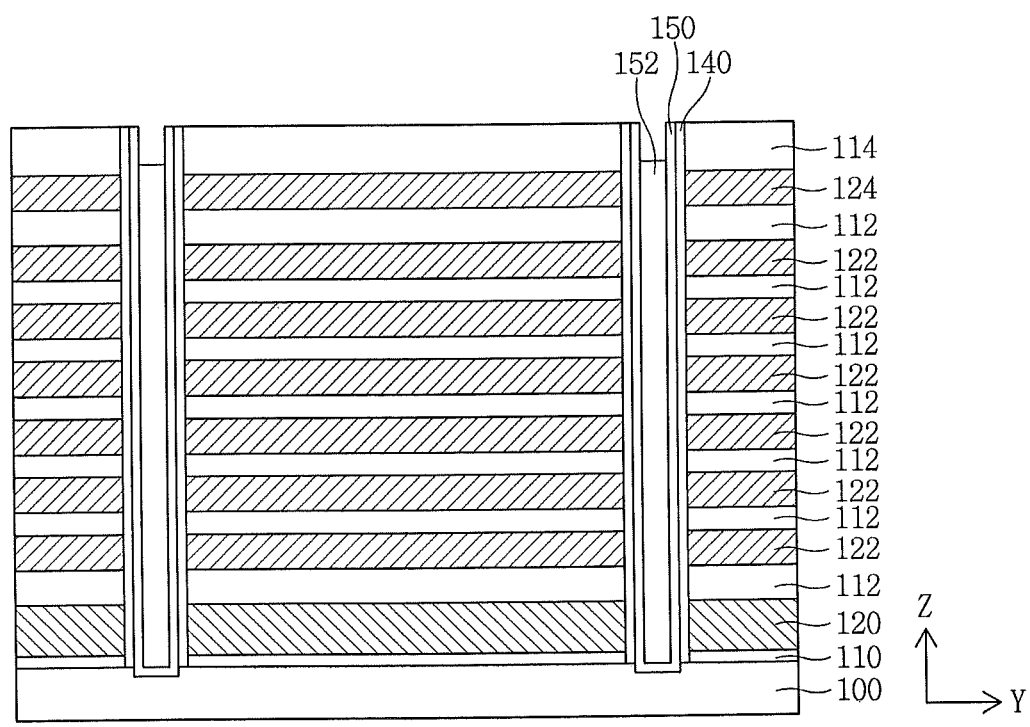

Referring to FIG. 3D, the method may include forming a vertical channel 150 on the charge storage layer 140 and the substrate 100 exposed in the channel hole 130. A structure in which the charge storage layer 140 and the vertical channel 150 are sequentially stacked may be formed on the sidewall of the channel hole 130. The vertical channel 150 may include undoped intrinsic polycrystalline silicon. In addition, the method may include forming a filling insulating layer 152 on the vertical channel 150 in the channel hole 130. Since an upper surface of the filling insulating layer 152 is located at a lower level than an upper surface of the upper insulating layer 114 relative to the upper surface of the substrate 100, a part of an upper portion of the channel hole 130 may not be filled. The upper surface of the filling insulating layer 152 may be located at a higher level than an upper surface of the preliminary string selection gate electrode 124.

Figure 3E:
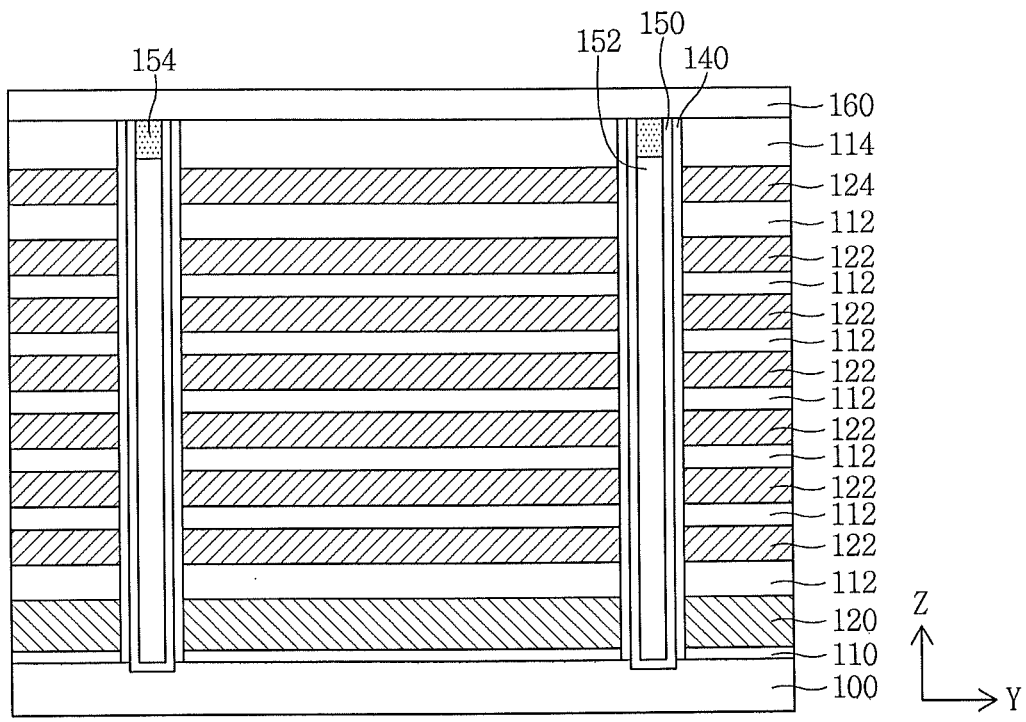

Referring to FIG. 3E, the method may include forming a channel pad 154 filling the upper portion of the channel hole 130 on the sidewall of the vertical channel 150 and on the filling insulating layer 152, and forming a lower capping insulating layer 160 on the upper insulating layer 114, the charge storage layer 140, the vertical channel 150, and the channel pad 154. For example, forming the channel pad 154 may include forming a conductive material on the vertical channel 150, the filling insulating layer 152, and the upper insulating layer 114, and planarizing the conductive material to expose the upper surface of the upper insulating layer 114. The channel pad 154 may include a conductive material, for example, polycrystalline silicon that is doped with an impurity.

Figure 3F:
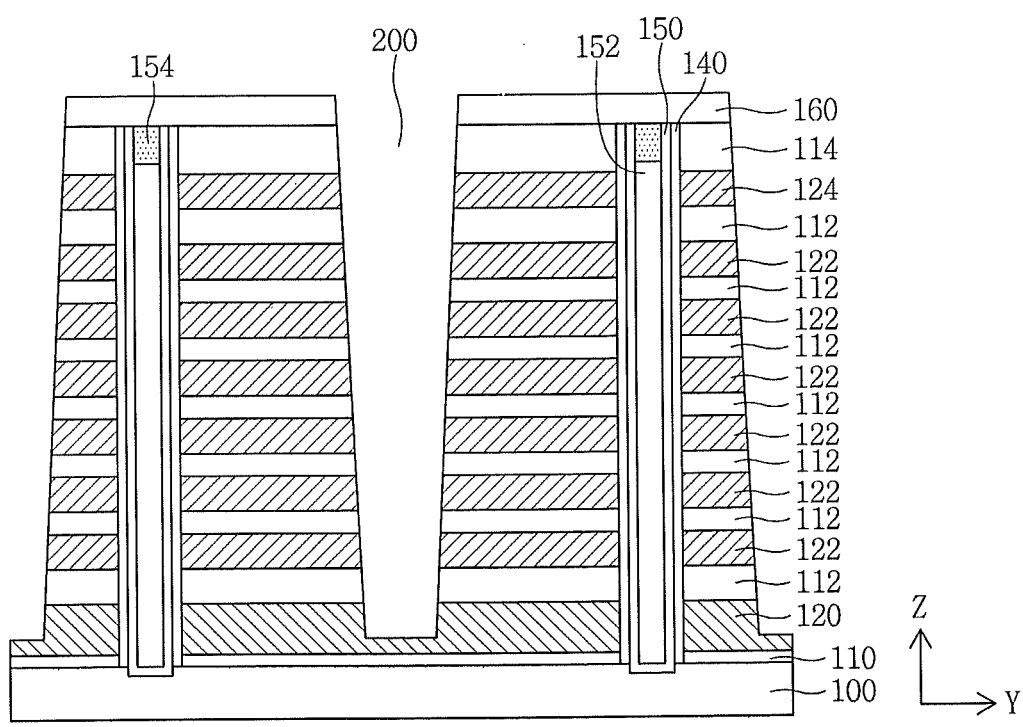

Referring to FIG. 3F, the method may include forming a trench 200 by anisotropically etching the intermediate insulating layers 112, upper insulating layer 114, lower capping insulating layer 160, preliminary cell gate electrodes 122, preliminary string selection gate electrode 124, and preliminary ground selection gate electrode 120 disposed between adjacent vertical channels 150. The trench 200 may vertically pass through the intermediate insulating layers 112, the upper insulating layer 114, the lower capping insulating layer 160, the preliminary cell gate electrodes 122, and the preliminary string selection gate electrode 124, and partially recess the preliminary ground selection gate electrode 120. The partially etched preliminary ground selection gate electrode 120 may form the bottom of the trench 200. The trench 200 may extend in the X direction. Side surfaces of the intermediate insulating layers 112, upper insulating layer 114, lower capping insulating layer 160, preliminary cell gate electrodes 122, and preliminary string selection gate electrode 124, and a part of a side surface of the preliminary ground selection gate electrode 120 may be exposed by the trench 200. A width of an upper portion of the trench 200 may be greater than a width of the lower portion of the trench 200 due to anisotropic etching characteristics. For example, the sidewalls of the trench may be slanted with respect to the upper surface of the substrate 100. Accordingly, the side surfaces of the preliminary string selection gate electrode 124, the preliminary cell gate electrodes 122, and the preliminary ground selection gate electrode 120, which are exposed by the sidewalls of the trench 200, may not be vertically aligned Referring to FIG. 3G, the method may include forming an expanded trench 210 by partially laterally etching the preliminary ground selection gate electrode 120, the preliminary cell gate electrodes 122, and the preliminary string selection gate electrode 124 which are exposed by the trench 200, and the preliminary ground selection gate electrode 120 remaining on the bottom of the trench 200. For example, the method may include selectively etching the preliminary ground selection gate electrode 120, the preliminary cell gate electrodes 122, and the preliminary string selection gate electrode 124 by performing a wet etching process using an etchant containing aqueous ammonia. Accordingly, a sidewall of the expanded trench 210 may include laterally recessed sidewalls of the preliminary ground selection gate electrode 120, the preliminary cell gate electrodes 122, and the preliminary string selection gate electrode 124 with respect to the respective sidewalls of the lower, intermediate, and upper insulating layers 110, 112, and 114. The sidewalls of the lower, intermediate, and upper insulating layers 110, 112, and 114 may protrude laterally toward a central axis of the expanded trench 210 more than the recessed sidewalls of the preliminary ground selection gate electrode 120, the preliminary cell gate electrodes 122, and the preliminary string selection gate electrode 124.

The preliminary ground selection gate electrode 120 may be formed of undoped polycrystalline silicon. The undoped polycrystalline silicon may have an etch rate greater than an etch rate of doped polycrystalline polysilicon. Accordingly, FIGS. 3G to 3J illustrate the preliminary ground selection gate electrode 120 is laterally recessed greater than the preliminary cell gate electrode 122, when the preliminary ground selection gate electrode 120 includes undoped polycrystalline silicon, and the preliminary cell gate electrodes 122 and the preliminary string selection gate electrode 124 includes doped polycrystalline silicon.

An etch rate of polycrystalline silicon may vary depending on a doping concentration of impurities when an etchant containing, for example, aqueous ammonia is used. An each rate may decrease as a doping concentration increases. Accordingly, laterally recessed distances of the preliminary ground selection gate electrode 120, the preliminary cell gate electrodes 122, and the preliminary string selection gate electrode 124 may be different from each other. The recessed distances of the preliminary ground selection gate electrode 120, the preliminary cell gate electrodes 122, and the preliminary string selection gate electrode 124 may decrease along the Z direction, from a lower portion to an upper portion of the expanded trench 210 relative to the substrate 100.

In some embodiments, the doping concentrations of the preliminary ground selection gate electrode 120, the preliminary cell gate electrodes 122, and the preliminary string selection gate electrode 124, as well as the etchant may be selected so that the sidewalls of the preliminary ground selection gate electrode 120, the preliminary cell gate electrodes 122, and the preliminary string selection gate electrode 124 exposed by the expanded trench 210 may be substantially vertically aligned after the expanded trench 210 is formed. Horizontal widths of portions of the lower, intermediate, and upper insulating layers 110, 112, and 114 that are laterally protrude from the recessed sidewalls of the preliminary ground selection gate electrode 120, preliminary cell gate electrodes 122, and preliminary string selection gate electrode 124 may decrease from the bottom toward the top in the expanded trench 210. It will be understood that each of the horizontal widths of the portions of the lower, intermediate, and upper insulating layers 110, 112, and 114 can be an average horizontal width of the respective portions of the lower, intermediate, and upper insulating layers 110, 112, and 114 because each of the sidewalls of the lower, intermediate, and upper insulating layers 110, 112, and 114 may be slanted with respect to the upper surface of the substrate 100.

Figure 3G:
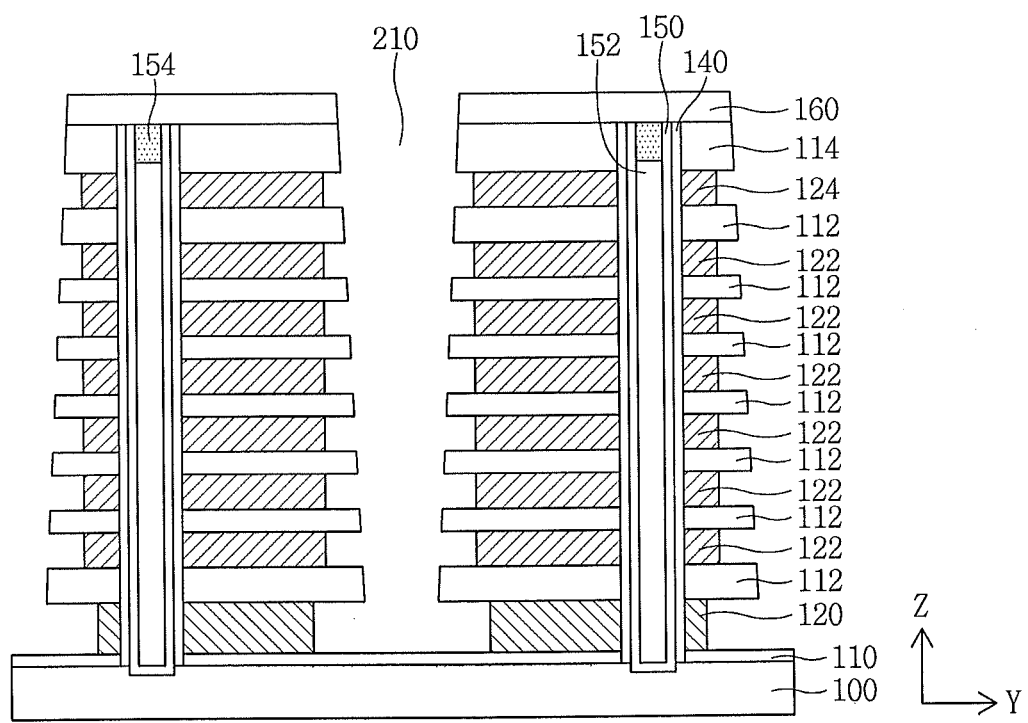

Although FIG. 3G illustrates that each of the recessed sidewalls of the preliminary ground selection gate electrode 120, the preliminary cell gate electrodes 122 and the preliminary string selection gate electrode 124 is substantially perpendicular to the upper surface of the substrate 100, it will be understood that each of the recessed sidewalls of the preliminary ground selection gate electrode 120, the preliminary cell gate electrodes 122 and the preliminary string selection gate electrode 124 can be slanted with respect to the upper surface of the substrate 100, particularly if the doping concentration within each individual preliminary ground selection gate electrode 120, preliminary cell gate electrodes 122 and preliminary string selection gate electrode 124 is uniform. Accordingly, midpoints of the recessed sidewalls of the preliminary ground selection gate electrode 120, the preliminary cell gate electrodes 122, and the preliminary string selection gate electrode 124 may be substantially vertically aligned.

Figure 3H:
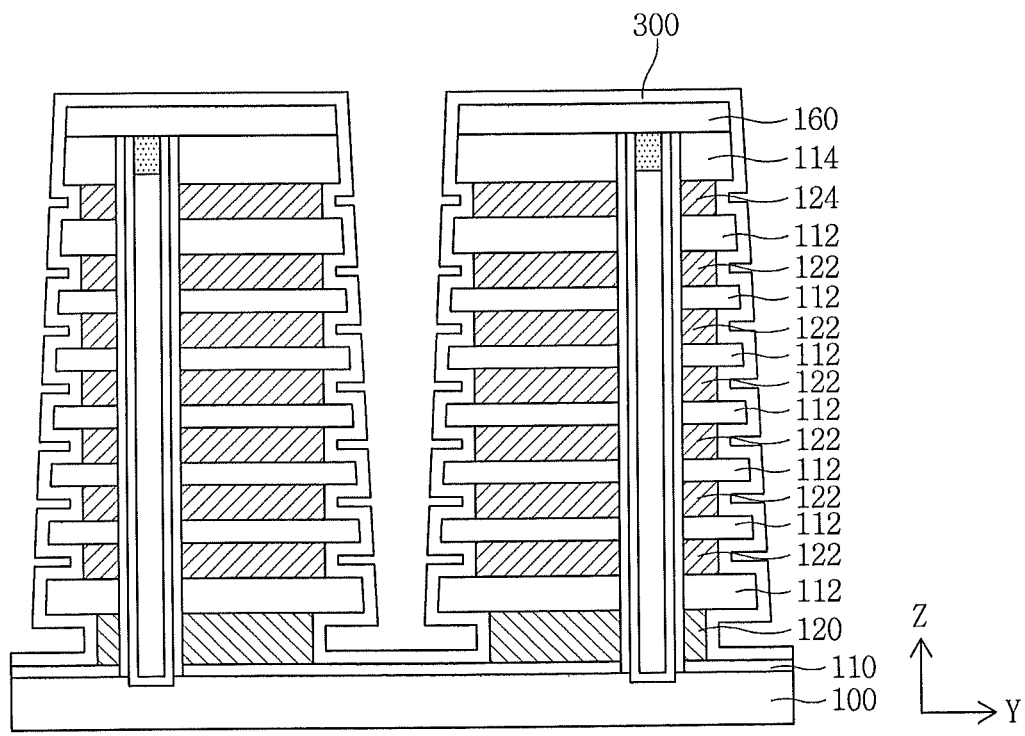

Referring to FIG. 3H, the method may include forming a metal layer 300 on the inner wall of the expanded trench 210. In some embodiments, the metal layer 300 may be conformally formed on the inner wall of the expanded trench 210. The metal layer 300 may include, for example, titanium, tantalum, tungsten, cobalt, or nickel.

Figure 3I:
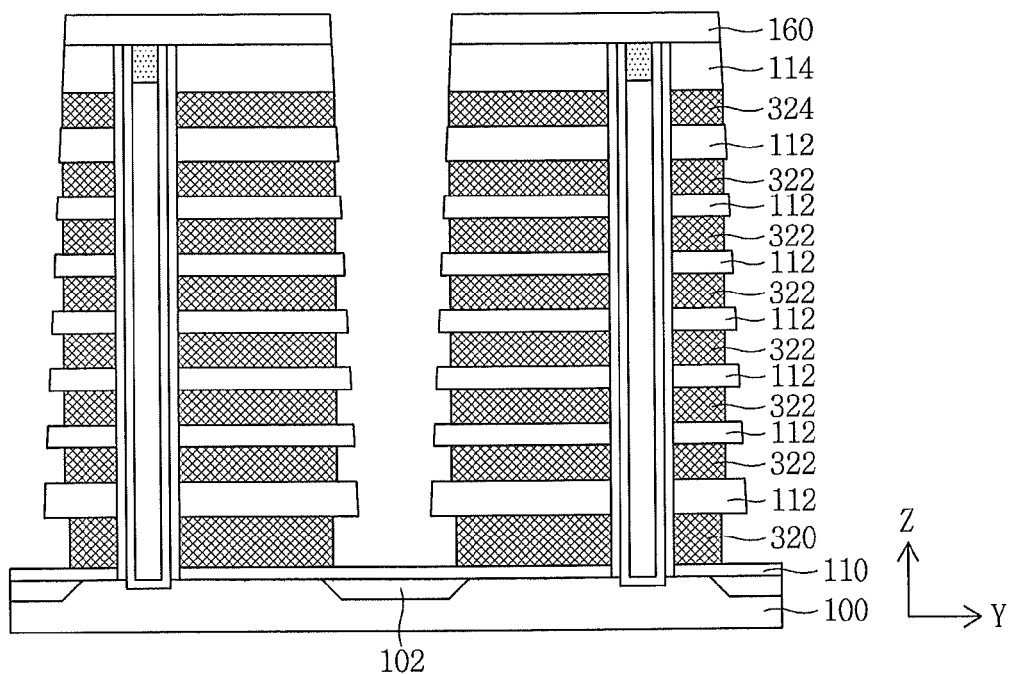

Referring to FIG. 3I, the method may include converting the preliminary ground selection gate electrode 120, the preliminary cell gate electrodes 122, and the preliminary string selection gate electrode 124 into a ground selection gate electrode 320, cell gate electrodes 322, and a string selection gate electrode 324, respectively, by performing a silicidation process. The ground selection gate electrode 320, the cell gate electrodes 322, and the string selection gate electrode 324 may include, for example, titanium silicide, tantalum silicide, tungsten silicide, cobalt silicide, or nickel silicide. The ground selection gate electrode 320, the cell gate electrodes 322, and the string selection gate electrode 324 may include metal silicide layers having substantially the same material composition because of amounts of polycrystalline silicon in the preliminary gate electrodes 120, 122, and 124 may be substantially the same. In addition, since volumes of the preliminary ground selection gate electrode 120, the preliminary cell gate electrodes 122, and the preliminary string selection gate electrode 124 expand during the silicidation process, the recessed distances may decrease. Portions of the metal layer 300 not reacted during the silicidation process may be removed by a wet etchant. The method may include forming an impurity region 102 in the substrate 100 at the bottom of the expanded trench 210 using, for example, an ion-injection process. For example, the method may include ion-injecting n-type impurities such as phosphorus (P) or arsenic (As) into the substrate 100 exposed by the expanded trench 210.

Figure 3J:
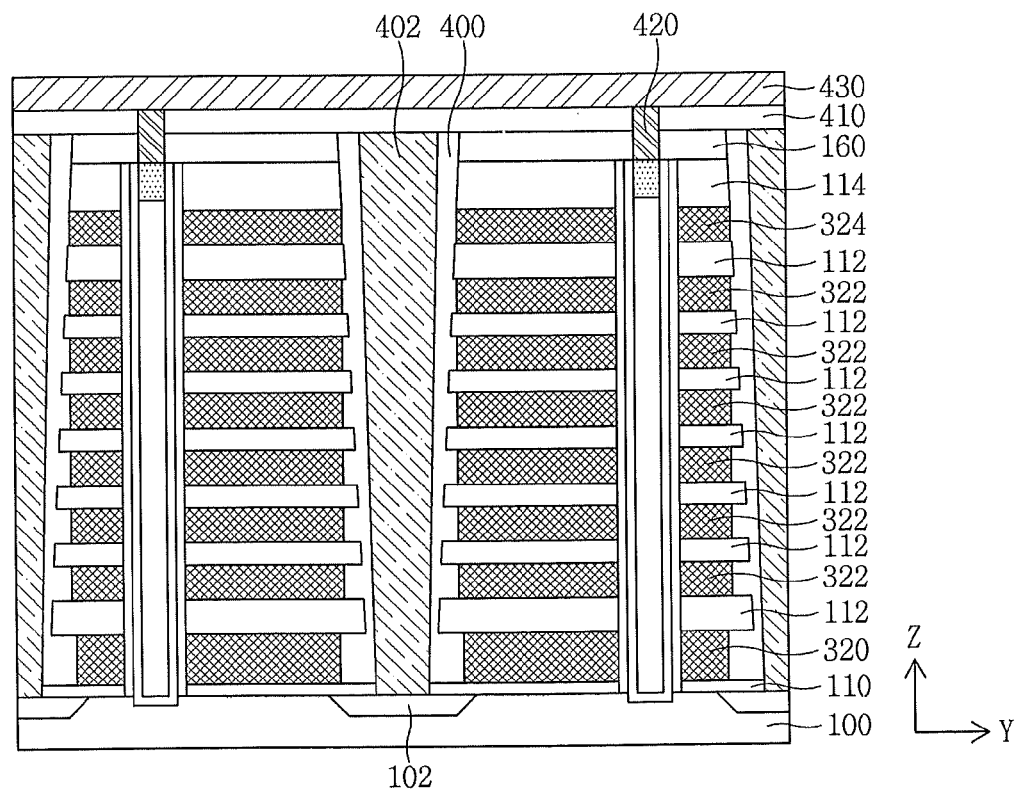

Referring to FIG. 3J, the method may include forming an insulating spacer 400 on the inner wall of the expanded trench 210. For example, forming the insulating spacer 400 may include forming an insulating material on the inner sidewall of the expanded trench 210, a surface of the lower insulating layer 110 exposed by the expanded trench 210, and an upper surface of the lower capping insulating layer 160, and removing the insulating material and the lower insulating layer 110 to expose an upper surface of the substrate 100 on the bottom of the expanded trench 210 by performing an anisotropic etching method.

The method may include forming a common source line 402 filling the expanded trench 210 on the insulating spacer 400. The common source line 402 may be electrically connected to the impurity region 102 of the substrate 100 and may extend in the X direction. The common source line 402 may include a metal, a metal silicide, or a combination thereof. For example, the common source line 402 may include tungsten, aluminum, copper, or a metal silicide.

The method may include forming an upper capping insulating layer 410 on the lower capping insulating layer 160, the insulating spacer 400, and the common source line 402, and forming bitline contact plugs 420 passing through the upper capping insulating layer 410 and electrically connected to the channel pad 154.

The method may include forming a bitline 430 connecting the bitline contact plugs 420 on the upper capping insulating layer 410. The bitline 430 may have a line shape extending in the Y direction.

According to a method of forming a semiconductor device, the preliminary ground selection gate electrode 120, the preliminary cell gate electrodes 122, and the preliminary string selection gate electrode 124 may be respectively converted into the ground selection gate electrode 320, the cell gate electrodes 322, and the string selection gate electrode 324, by performing the silicidation process after forming the preliminary ground selection gate electrode 120, preliminary cell gate electrodes 122, and preliminary string selection gate electrode 124, which include a conductive material such as polycrystalline silicon. The ground selection gate electrode 320, the cell gate electrodes 322, and the string selection gate electrode 324 may include metal silicide layers having substantially the same material composition because the amounts of polycrystalline silicon in the preliminary gate electrodes 120, 122, and 124 may be substantially the same. Accordingly, resistances of the ground selection gate electrode 320, the cell gate electrodes 322, and the string selection gate electrode 324 may be substantially the same, and thus electrical characteristics of a semiconductor device may be improved.

Figure 4:
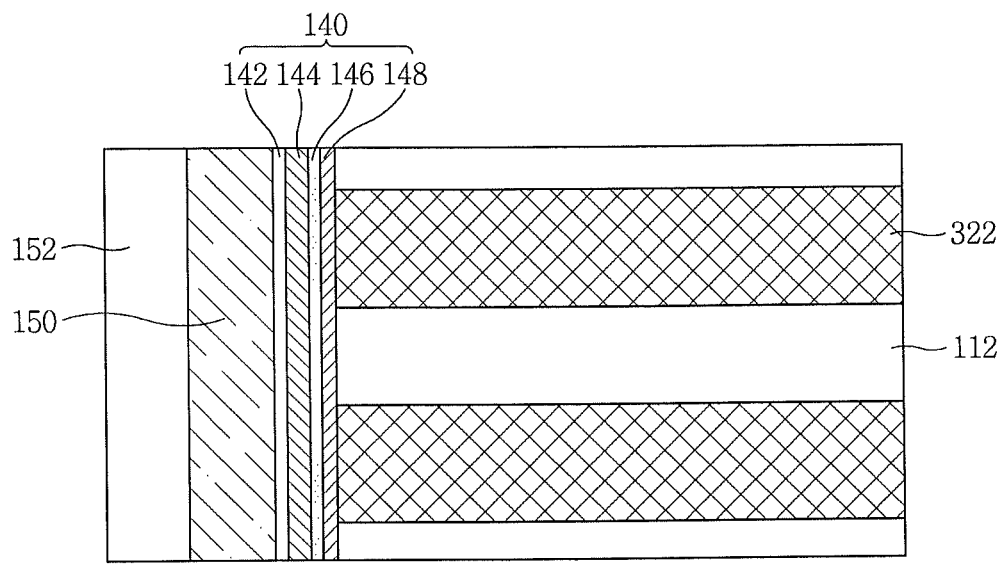
FIG. 4 is an enlarged cross-sectional view of area A in FIG. 2.

FIG. 4 is an enlarged cross-sectional view of area A in FIG. 2.

Referring to FIG. 4, the vertical channel 150 may have the form of a cylinder extending in the Z direction. The intermediate insulating layers 112 and the cell gate electrodes 322 may be alternately stacked in the Z direction.

The charge storage layer 140 may be interposed between the vertical channel 150 and the intermediate insulating layers 112 and plurality of cell gate electrodes 322. The charge storage layer 140 may surround an outer sidewall of the vertical channel 150.

The charge storage layer 140 may include a tunnel insulating layer 142, a charge trapping film 144, an internal blocking insulating layer 146, and an external blocking insulating layer 148 sequentially stacked from the vertical channel 150 toward the cell gate electrodes 322. The external blocking insulating layer 148 formed at the outermost side of the charge storage layer 140 may be in contact with the cell gate electrodes 322.

The tunnel insulating layer 142 may include, for example, silicon oxide. The charge trapping film 144 may include a charge trapping layer including, for example, silicon nitride. The charge trapping film 144 may include an insulating layer including quantum dots or nano-crystalline materials. The internal or external blocking insulating layers 146 and 148 may include, for example, silicon oxide or a metal oxide.

Figure 5:
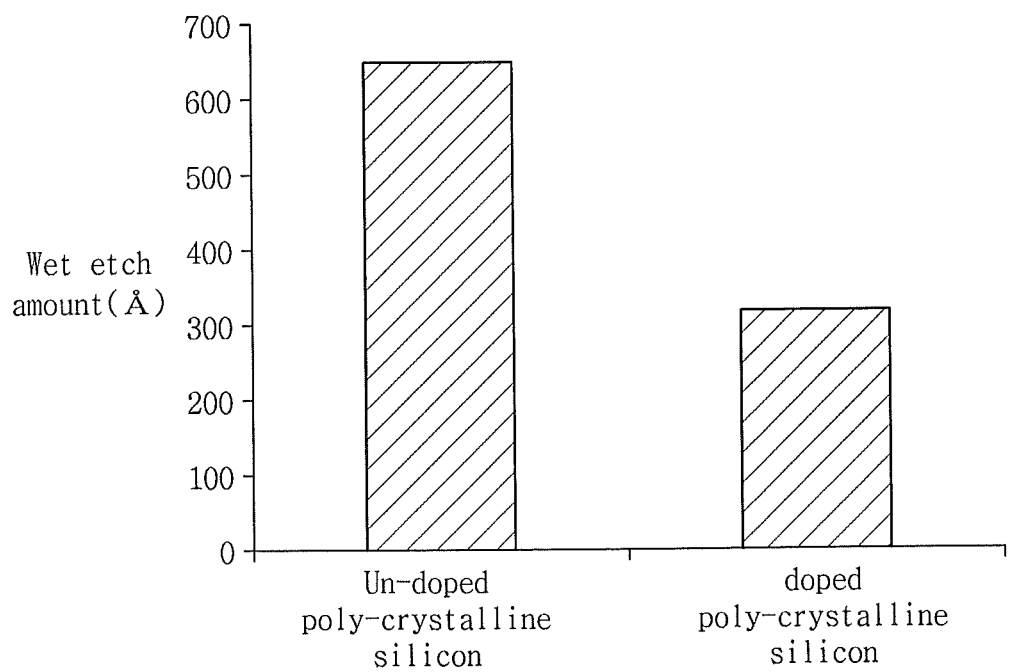
FIG. 5 is a graph showing the difference in etch amounts of un-doped polycrystalline silicon and doped polycrystalline silicon.

FIG. 5 is a graph showing the difference in etch amounts of un-doped polycrystalline silicon and doped polycrystalline silicon.

Referring to FIG. 5, the doped polycrystalline silicon shows a smaller etch amount than the undoped polycrystalline silicon. Impurities in the doped polycrystalline silicon are phosphorus (P), and the doping concentration is 1E21 atoms/cm3. The etch amounts shown in the graph are measured after performing a wet-etching process by dipping the doped polycrystalline silicon and the undoped polycrystalline silicon in an etchant including aqueous ammonia for one minute.

Figure 6A:
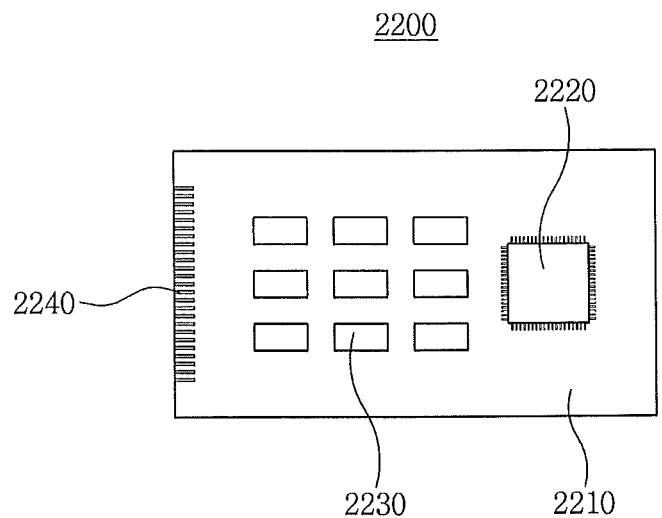
FIG. 6A is a diagram illustrating a module including a semiconductor device according to some embodiments of the present inventive concept.

FIG. 6A is a diagram illustrating a module including a semiconductor device according to some embodiments of the present inventive concept. Referring to FIG. 6A, a semiconductor module 2200 may include a processor 2220 and semiconductor devices 2230 which are mounted on a module substrate 2210. The processor 2220 and the semiconductor devices 2230 may include a semiconductor device according some embodiments of the present inventive concept. Input/output terminals 2240 may be arranged on at least one side of the module substrate 2210.

Figure 6B:
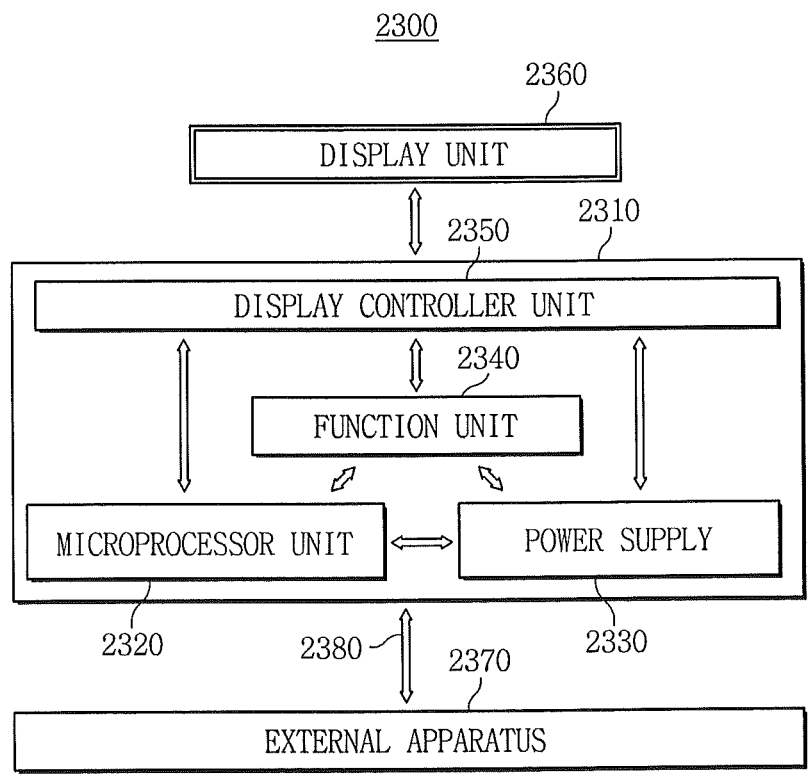
FIGS. 6B and 6C are block diagrams illustrating electronic systems including a semiconductor device according to some embodiments of the present inventive concept.
Figure 6C:
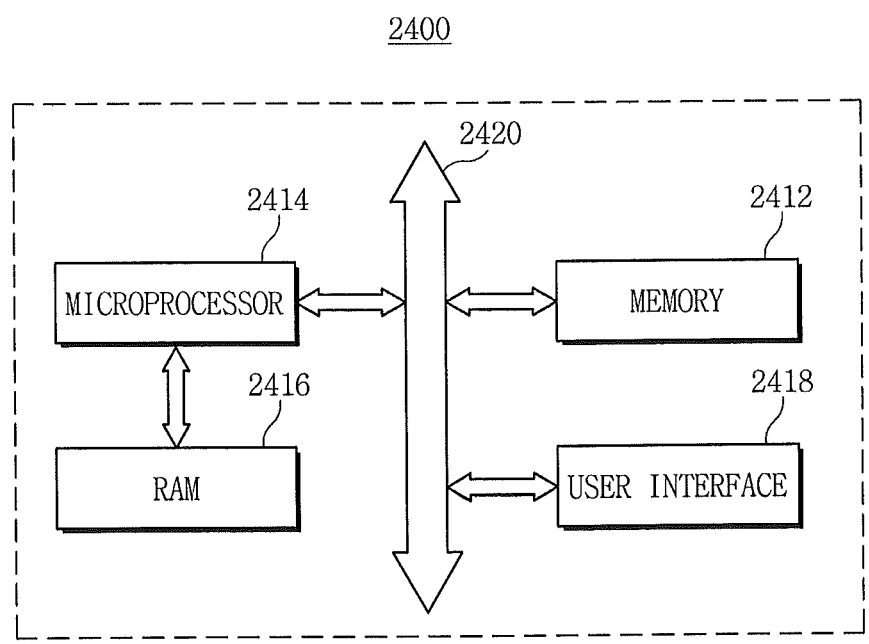

FIGS. 6B and 6C are block diagrams illustrating electronic systems including a semiconductor device according to some embodiments of the present inventive concept.

Referring to FIG. 6B, an electronic system 2300 may include a body 2310, a display unit 2360, and an external apparatus 2370. The body 2310 may include a microprocessor unit 2320, a power supply 2330, a function unit 2340, and/or a display control unit 2350. The body 2310 may include a system board or motherboard including a printed circuit board (PCB), and/or a case. The microprocessor unit 2320, the power supply 2330, the function unit 2340, and the display control unit 2350 may be installed or arranged on an upper surface or an inside of the body 2310. A display unit 2360 may be arranged inside or outside of the body 2310.

The display unit 2360 may display an image processed by the display control unit 2350. For example, the display unit 2360 may include a liquid crystal display (LCD), an active matrix organic light emitting diode (AMOLED), or a variety of display panels. The display unit 2360 may include a touch-screen. Accordingly, the display unit 2360 may have an input/output function.

The power supply 2330 may supply a current or voltage to the microprocessor unit 2320, the function unit 2340, and the display control unit 2350, etc. The power supply 2330 may include a rechargeable battery, a socket for the battery, or a voltage/current converter.

The microprocessor unit 2320 may receive a voltage from the power supply 2330 to control the function unit 2340 and the display unit 2360. For example, the microprocessor unit 2320 may include a CPU or an application processor (AP).

The function unit 2340 may perform various functions of the electronic system 2300. For example, the function unit 2340 may include a touch-pad, a touch-screen, a volatile/nonvolatile memory, a memory card controller, a camera, a light, an audio and video playback processor, a wireless transmission/reception antenna, a speaker, a microphone, a USB port, and other units having various functions. The microprocessor unit 2320 or the function unit 2340 may include a semiconductor device according some embodiments of the present inventive concept.

Referring to FIG. 6C, an electronic system 2400 may include a microprocessor 2414, a memory system 2412, and a user interface 2418 which perform data communication using a bus 2420. The microprocessor 2414 may include a CPU or an AP. The electronic system 2400 may further include a random access memory (RAM) 2416, which directly communicates with the microprocessor 2414. The microprocessor 2414 and/or the RAM 2416 may be assembled in a single package. The user interface 2418 may be used to input data to or output data from the electronic system 2400. For example, the user interface 2418 may include a touch-pad, a touch-screen, a keyboard, a mouse, a scanner, a voice detector, a cathode ray tube (CRT) monitor, an LCD, an AMOLED, a plasma display panel (PDP), a printer, a light, or various other input/output devices. The memory system 2412 may store codes for operating the microprocessor 2414, data processed by the microprocessor 2414, or external input data. The memory system 2412 may include a memory controller, a hard disk, or a solid state drive (SSD). The microprocessor 2414, the RAM 2416, and/or the memory system 2412 may include a semiconductor device according some embodiments of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of forming an integrated circuit device, the method comprising:
 forming a stack comprising a plurality of insulating patterns alternating with a plurality of conductive patterns on an upper surface of a substrate;
 forming a hole through the stack, the hole exposing sidewalls of the plurality of insulating patterns and the plurality of conductive patterns,
 wherein the sidewalls of the plurality of insulating patterns are aligned along a first plane that is slanted with respect to the upper surface of the substrate, and
 midpoints of the respective sidewalls of the plurality of conductive patterns are aligned along a second plane that is substantially perpendicular to the upper surface of the substrate.

2. The method of claim 1, wherein each of the sidewalls of the plurality of conductive patterns is recessed with respect to an adjacent one of the sidewalls of the plurality of insulating patterns.

3. The method of claim 1, wherein:
 the plurality of conductive patterns comprise a respective plurality of semiconductor patterns that are doped with an impurity; and
 the plurality of conductive patterns have impurity concentrations different from each other.

4. The method of claim 3, wherein a lower one of the plurality of conductive patterns relative to the substrate has a first impurity concentration and an upper one of the plurality of conductive patterns relative to the substrate has a second impurity concentration higher than the first impurity concentration.

5. The method of claim 1, wherein forming the hole comprises:
 forming a preliminary hole through the stack by etching the plurality of insulating patterns and the plurality of conductive patterns; and
 laterally etching the plurality of conductive patterns exposed by the preliminary hole.

6. The method of claim 5, wherein laterally etching the plurality of conductive patterns comprises laterally etching an upper one of the plurality of conductive patterns relative to the substrate less than a lower one of the plurality of conductive patterns relative to the substrate.

7. The method of claim 5, wherein laterally etching the plurality of conductive patterns comprises performing a wet etch process using an etchant comprising ammonia.

8. The method of claim 1, further comprising converting each of the plurality of conductive patterns into a metal silicide after laterally etching the plurality of conductive patterns.

9. The method of claim 1, wherein:
 the integrated circuit device comprises a vertical nonvolatile memory device;

a lowermost one of the plurality of conductive patterns relative to the substrate comprises a ground selection gate electrode and an uppermost one of the plurality of conductive patterns relative to the substrate comprises a string selection gate electrode.

10. A method of forming an integrated circuit device, the method comprising:

forming a plurality of insulating patterns alternating with a plurality of semiconductor patterns on a substrate;

performing a first etching process to etch the plurality of insulating patterns and the plurality of semiconductor patterns to form a preliminary hole exposing sidewalls of the plurality of insulating patterns and the plurality of semiconductor patterns, wherein an upper one of the plurality of semiconductor patterns relative to the substrate is laterally etched more than a lower one of the plurality of semiconductor patterns relative to the substrate; and then performing a second etching process to laterally etch the sidewalls of the plurality of semiconductor patterns to expand the preliminary hole into a hole, wherein the upper one of the plurality of semiconductor patterns is laterally etched less than the lower one of the plurality of semiconductor patterns.

11. The method of claim 10, wherein the sidewalls of the plurality of semiconductor patterns comprising a sidewall of the hole are aligned along a plane substantially perpendicular to an upper surface of the substrate.

12. The method of claim 11, wherein:

the sidewalls of the plurality of insulating patterns comprising the sidewall of the hole are aligned along a plane slanted with respect to the upper surface of the substrate; and each of the sidewalls of the plurality of insulating patterns protrudes laterally toward a central axis of the hole more than the sidewall of an adjacent one of the plurality of semiconductor patterns.

13. The method of claim 10, wherein each of the plurality of semiconductor patterns except for the semiconductor pattern that is closest to the substrate has an impurity concentration that exceeds an impurity concentration of a respective one of the plurality of semiconductor patterns that is directly below it.

14. The method of claim 10, wherein each of the plurality of semiconductor patterns except for the semiconductor pattern that is closest to the substrate is laterally etched more than a respective one of the plurality of semiconductor patterns that is directly below it during the first etching process and is laterally etched less than the respective one of the plurality of semiconductor patterns during the second etching process.

15. The method of claim 10, wherein each of the plurality of semiconductor patterns comprise a polysilicon layer, and the method further comprises:

forming a metal layer on a sidewall of the hole; and performing a silicidation process to transform the plurality of semiconductor patterns into a respective plurality of metal silicide patterns, wherein sidewalls of the plurality of metal silicide patterns that are exposed by the hole are substantially vertically aligned.

16. A method of forming a vertical nonvolatile memory device, the method comprising:

forming a plurality of insulating patterns alternating with a plurality of semiconductor patterns on a substrate, wherein the plurality of semiconductor patterns have impurity concentrations that are different from each other;

etching the plurality of insulating patterns and the plurality of semiconductor patterns to form a preliminary hole, the preliminary hole having a sidewall that is slanted with respect to an upper surface of the substrate; and laterally etching the plurality of semiconductor patterns exposed by the preliminary hole to form a hole, wherein sidewalls of the plurality of semiconductor patterns comprising a sidewall of the hole are aligned along a plane substantially perpendicular to the upper surface of the substrate.

17. The method of claim 16, wherein an upper one of the plurality of semiconductor patterns relative to the substrate has a first impurity concentration and a lower one of the plurality of semiconductor patterns relative to the substrate has a second impurity concentration that is lower than the first impurity concentration.

18. The method of claim 16, further comprising:

forming a metal layer on the sidewall of the hole; and performing a silicidation process to transform the plurality of semiconductor patterns into a respective plurality of metal silicide patterns.

19. The method of claim 16, wherein:

sidewalls of the plurality of insulating patterns comprises the sidewall of the hole; and each of the sidewalls of the plurality of insulating patterns protrudes laterally toward a central axis of the hole more than the sidewall of an adjacent one of the plurality of semiconductor patterns.

20. The method of claim 16, further comprising forming a channel pattern extending through the plurality of insulating patterns and the plurality of semiconductor patterns.

* * * * *